United States Patent [19]

Adlhoch

[11] 4,150,308
[45] Apr. 17, 1979

[54] CMOS LEVEL SHIFTER

[75] Inventor: Richard H. Adlhoch, Tempe, Ariz.

[73] Assignee: Motorola, Inc., Schaumburg, Ill.

[21] Appl. No.: 844,762

[22] Filed: Oct. 25, 1977

[51] Int. Cl.$^2$ .................... H03K 17/60; H03K 17/04; H03K 3/286; H03K 3/353

[52] U.S. Cl. ................ 307/264; 307/200 B; 307/208; 307/251; 307/279; 307/DIG. 1

[58] Field of Search .............. 307/205, 214, 264, 268, 307/270, 279, DIG. 1, 208, 200 B, 251

[56] References Cited

U.S. PATENT DOCUMENTS

| | | | |
|---|---|---|---|
| 3,676,700 | 7/1972 | Buchanan | 307/DIG. 1 X |
| 3,765,002 | 10/1973 | Basse | 307/279 X |
| 3,823,330 | 7/1974 | Rapp | 307/DIG. 1 X |
| 3,900,746 | 8/1975 | Kraft et al. | 307/DIG. 1 X |
| 3,906,254 | 9/1975 | Lane | 307/DIG. 1 X |
| 3,965,460 | 6/1976 | Barbara | 307/205 X |
| 4,000,411 | 12/1976 | Sano et al. | 307/DIG. 1 X |
| 4,023,050 | 5/1977 | Fox et al. | 307/DIG. 1 X |
| 4,029,973 | 6/1977 | Kobayashi et al. | 307/DIG. 1 X |
| 4,045,691 | 8/1977 | Asano | 307/DIG. 1 X |
| 4,080,539 | 3/1978 | Stewart | 307/DIG. 1 X |

OTHER PUBLICATIONS

Lohman, "Application of MOSFET's in Microelectronics", *SCP and Solid–State Technology* (pub.) pp. 23–29, 3/1966.

*Primary Examiner*—Larry N. Anagnos
*Attorney, Agent, or Firm*—Joe E. Barbee

[57] ABSTRACT

A level shifter using complementary metal oxide semiconductor (CMOS) transistors is provided. A first transistor couples a first voltage to a node of the level shifter circuit, and the first transistor is controlled by an input signal. A P-channel and an N-channel MOS device are connected in series between the first voltage and a second voltage. The gate electrodes of the P-channel and N-channel MOS devices are connected to the node. An output for the level shifter circuit is taken from a junction formed by the P-channel and N-channel MOS devices. A resistance is coupled between the gate electrodes of the P-channel and the N-channel MOS devices and the second voltage.

4 Claims, 4 Drawing Figures

CMOS LEVEL SHIFTER

BACKGROUND OF THE INVENTION

This invention relates, in general, to voltage level shifters and more particularly, to those voltage level shifters using complementary metal oxide semiconductor (CMOS) devices.

In many instances CMOS logic circuits operate from a power supply ranging from zero to plus five volts. However, when interfacing CMOS logic circuits with other circuits, such as industrial controls or display drivers, it is often desirable to have a larger voltage swing than from zero to plus five volts. Of course, generally speaking, the higher the voltage swing the more immune the circuit is to spurious noise transients. Such spurious noise transients are more likely to occur in an industrial environment. Accordingly, it will be appreciated that it would be desirable to have a circuit that can interface with a CMOS logic circuit and shift the output voltage swing of the CMOS circuit to one which is compatible with a circuit requiring a wider voltage swing or a different voltage level. It is desirable to have such an interface circuit that is small in size, fast in operating speed, and does not consume much power.

Accordingly, it is an object of the present invention to provide an improved CMOS level shifter circuit.

Yet another object of the present invention is to provide a level shifter circuit that has the advantages of speed, size, and low power consumption.

SUMMARY OF THE INVENTION

In carrying out the above and other objects of the invention in one form, there is provided an improved level shifter circuit requiring one input and capable of providing two outputs which are complements of each other. First means are provided for controllably switching a first voltage level to a first node of the level shifting circuit. A second means for controllably switching the first voltage level to the output terminal has a control terminal which is coupled to the first node. A third means for controllably switching a second voltage level to the output terminal has a control electrode which is also coupled to the first node. A resistive means couples the control electrode of the second means to the second voltage level.

The subject matter which is regarded as the invention is set forth in the appended claims. The invention itself, however, together with further objects and advantages thereof, may be better understood by referring to the following detailed description taken in conjuction with the accompanying drawings.

The exemplifications set out herein illustrate the preferred embodiments of the invention in one form thereof, and such exemplifications are not to be construed as limiting in any manner.

DESCRIPTION OF THE PREFERRED EMBODIMENTS

Figure 1A:
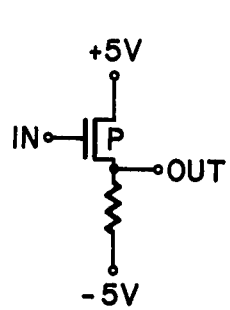
FIGS. 1 (a) and 1 (b) illustrate some prior art level shifter circuits.
Figure 1B:
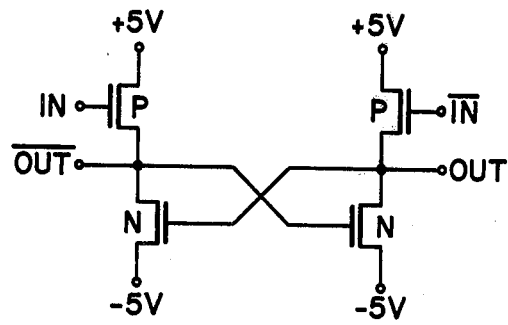

FIG. 1 (a) illustrates a simple resistive pull down type of level shifter circuit. The circuit has a P-channel MOS field effect transistor in series with a resistor. The input is connected to the gate electrode of the transistor while the output is taken from the junction of the transistor and the resistor. The disadvantages with this type of circuit is that it is generally a relatively slow operating circuit because of the large size of resistor required. If the resistor is made smaller to speed up the circuit, then more power is wasted by the additional current flow through the resistor.

FIG. 1 (b) is another prior art level shifter circuit commonly called a static powerless circuit. This circuit requires complementary input signals going to the two P-channel field effect transistors. Both P-channel field effect transistors must be relatively large in size which increases the over all size of the circuit. The circuit tends to be slow in operating speed due to the latching up of the circuit and the need to overcome the latching effect each time the opposite side is switched. This circuit consumes less power than does the circuit of FIG. 1 (a) since it does not use any resistors.

Figure 2:
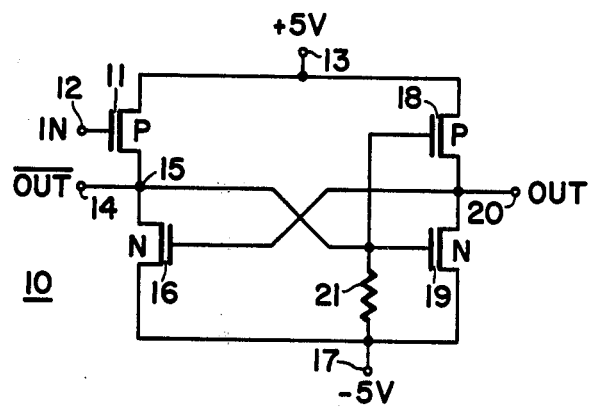
FIG. 2 illustrates the present invention in one form thereof.
Figure 3:
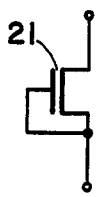
FIG. 3 illustrates a preferred form of a resistor used in the circuit of FIG. 2.

FIG. 2 illustrates schematically a circuit which overcomes the disadvantages with the above circuits without compromising the operation of the circuit. Circuit 10 takes an input signal whose negative swing is restricted (e.g. from plus five to zero volts) and provides an output whose swing goes more negative (e.g. from plus five volts to minus five volts) than does the input. CMOS level shifter 10 requires only one input appearing at input terminal 12. By way of example, the input can swing from zero to plus five volts. Input terminal 12 is connected to a gate electrode of P-channel field effect transistor 11. A first electrode of transistor 11 is connected to a terminal 13 which is a power supply terminal for receiving a voltage such as plus five volts. A second electrode of transistor 11 is connected to node 15. Node 15 is connected to gate electrodes of P-channel transistor 18 and N-channel transistor 19, respectively. A first electrode of field effect transistor 18 is connected to power supply terminal 13 while a second electrode of P-channel transistor 18 is connected to an output terminal 20. Also connected to output terminal 20 is a first electrode of transistor 19. A second electrode of transistor 19 is connected to a terminal 17 which is a second power supply terminal for receiving a voltage, such as minus five volts. A resistance, illustrated as resistor 21, is connected from the gate electrode of transistor 19 to power supply terminal 17. Although this resistance is illustrated as resistor 21 it will be understood that the resistance is preferrably provided by a P-channel field effect transistor having a first electrode connected to the gate electrode of transistor 19 and a gate electrode connected to its second electrode which are both connected to power supply terminal 17. FIG. 3 illustrates one form for obtaining resistor 21.

A complementary output can be obtained at an output terminal 14 which is connected to node 15. Also connected to node 15 is a first electrode of an N-channel field effect transistor 16. The second electrode of transistor 16 is connected to power supply terminal 17. A gate of transistor 16 is connected to output terminal 20. Transistors 18 and 19 form an inverter.

A positive input at terminal 12 causes transistor 11 to assume a nonconductive state. The negative voltage at power supply terminal 17 is coupled by resistive means 21 to the gate electrode of transistor 18 thereby enabling transistor 18. This causes the output terminal 20 to start going positive towards the voltage applied to power supply terminal 13. The negative voltage applied to the gate electrode of transistor 18 is also applied to the gate electrode of transistor 19 and tends to keep transistor 19 in a nonconductive state. The positive voltage at output terminal 20 is connected to the gate of transistor 16 which causes transistor 16 to become conductive thereby applying the negative voltage from power supply terminal 17 to output terminal 14 and to the gate electrode of transistor 18 thereby keeping transistor 18 in a conductive state. When the input voltage to terminal 12 switches from a positive level, transistor 11 becomes conductive and the voltage at node 15 starts to increase towards the positive voltage level applied to power supply terminal 13. Since node 15 is connected to the gate electrodes of transistors 18 and 19, transistor 18 will commence to cut off while transistor 19 will commence to conduct thereby coupling the negative voltage at power supply terminal 17 to output terminal 20. Since complementary output 14 is connected to node 15 its voltage will go positive towards the voltage applied at power supply terminal 13. When output terminal 20 goes negative it will cause transistor 16 to stop conducting since the gate electrode of transistor 16 is connected to output terminal 20. From the foregoing, it will be noted that an input voltage varying between zero and plus five volts can control transistor 11, thereby producing a voltage at output terminals 14 and 20 which vary between the voltages at power supply terminals 13 and 17, which are illustrated as being plus five volts and minus five volts, respectively.

Transistor 16 serves to provide the minus five volt drive to the gates of transistors 18 and 19. Although the resistor 21 starts to pull down the gates of transistors 18 and 19 when transistor 11 is off, the use of transistor 16 speeds up the operation thereby increasing the over all operating speed of CMOS level shifter circuit 10. The resistance illustrated by resistor 21 is typically 100k ohms although this resistor does not require a high degree of accuracy. As mentioned hereinbefore, preferably, the resistance is provided by a P-channel field effect transistor having a first electrode connected to the gate of transistor 19 and its second electrode and gate electrode connected to power supply terminal 17. FIG. 3 illustrates the preferred form of resistor 21. If the resistance illustrated by resistor 21 is not provided by a P-channel field effect transistor, but is provided by a diffused resistor it would typically require more silicon chip area than would a field effect transistor. Transistors 16, 18 and 19 can be as small as allowed by the limitations of present semiconductor photographic processes used in producing masks for semiconductor devices.

By way of example only the following sizes, in microns, are given for the devices used in circuit 10. The ratios are width-to-length area for each field effect transistor illustrated in FIG. 2. However, it should be remembered that 21 was illustrated as a resistor since this is its functional purpose.

| Transistor Number | Size |
| --- | --- |
| 11 | 75/10 |
| 16 | 7.5/7.5 |
| 18 | 10/10 |
| 19 | 7.5/7.5 |
| 21 | 10/10 |

By now, it should it be appreciated that there has been provided a level shifter circuit that is small in size without sacrificing speed of operation and only requires one input. In addition, the circuit has the capability of providing a complement of the output.

Consequently, while in accordance with the Patent Statutes, there has been described what at present is considered to be the preferred forms of the invention it will be obvious to those skilled in the art that numerous changes and modifications may be made herein without departing from the true spirit and scope of the invention, and it is therefore aimed in the following claims to cover all such modifications.

What is claimed as new and desired to secure by Letters Patent of the United States is:

1. A complementary metal oxide semiconductor level shifter circuit, comprising: a first transistor having a first electrode, a second electrode, and a gate electrode, the gate electrode being capable of receiving an input signal, the first electrode being capable of receiving a first voltage; a second transistor having a first electrode, a second electrode, and a gate electrode, the gate electrode of the second transistor being coupled to the second electrode of the first transistor, the first electrode of the second transistor being for coupling to the first voltage; a third transistor having a first electrode, a second electrode, and a gate electrode, the first electrode of the third tranistor being coupled to the second electrode of the second transistor and forming a first output node for the level shifter circuit, the gate electrode of the third transistor being coupled to the second electrode of the first transistor, and the second electrode of the third transistor being for coupling to a second voltage; a fourth transistor having a first electrode, a second electrode, and a gate electrode, the first electrode of the fourth transistor being coupled to the second electrode of the first transistor and forming a second output node, the gate electrode of the fourth transistor being coupled to the second electrode of the second transistor, and the second electrode of the fourth transistor being for coupling to the second voltage; and means for providing a resistance coupled between the gate electrode of the third transistor and the second voltage, thereby providing a level shifter circuit capable of shifting the level of a single input signal and obtaining two outputs which are complements to each other.

2. The level shifter circuit of claim 1 wherein the means for providing a resistance is a field effect transistor having a first electrode, a second electrode, and a gate electrode, the first electrode of the field effect transistor being coupled to the gate electrode of the third transistor, and the gate electrode and second electrode being for coupling to the second voltage.

3. A level shifting circuit for receiving an input which varies between a certain voltage amplitude and providing an output voltage capable of varying at a different amplitude, the level shifting circuit having an input terminal and at least one output terminal and being capable of being powered from a first and a second voltage level, comprising: first means for controllably switching the first voltage level to a first node of the level shifting circuit, the first means having a control electrode coupled to the input terminal; a second means for controllably switching the first voltage level to the output terminal, the second means having a control terminal coupled to the first node; a third means for controllably switching the second voltage level to the output terminal, the third means having a control electrode coupled to the first node; a fourth means for controllably switching the second voltage level to the first node, the fourth means having a control electrode coupled to the output terminal; and resistive means for coupling the control electrode of the third means to the second voltage level.

4. The level shifting circuit of claim 3 wherein the first, second, thrid, and fourth means are field effect transistors.

* * * * *